United States Patent
Chiang et al.

(10) Patent No.: US 9,287,841 B2
(45) Date of Patent: Mar. 15, 2016

(54) GAIN CONTROL CIRCUIT AND METHOD CAPABLE OF EASING LEAKAGE CURRENT INFLUENCE

(71) Applicant: REALTEK SEMICONDUCTOR CORPORATION, Hsinchu (TW)

(72) Inventors: Ming-Cheng Chiang, Hsinchu (TW); Yuan-Ping Hsu, Hsinchu (TW); Li-Lung Kao, New Taipei (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 78 days.

(21) Appl. No.: 14/334,498

(22) Filed: Jul. 17, 2014

(65) Prior Publication Data
US 2015/0048885 A1    Feb. 19, 2015

(30) Foreign Application Priority Data
Aug. 15, 2013    (TW) .............................. 102129373 A (51) Int. Cl.
*H03G 3/20* (2006.01)
*H03G 1/00* (2006.01)
*H03F 3/45* (2006.01)

(52) U.S. Cl.
CPC ......... *H03G 1/0023* (2013.01); *H03F 3/45475* (2013.01); *H03G 1/0088* (2013.01); *H03F 2203/45528* (2013.01); *H03F 2203/45534* (2013.01); *H03F 2203/45596* (2013.01); *H03F 2203/45616* (2013.01); *H03G 3/20* (2013.01)

(58) Field of Classification Search
CPC ......... H03G 7/02; H03G 3/22; H03G 3/3042; H03G 1/0088; H03G 1/007; G01V 1/245; H03F 3/72; H03F 3/45475; H03F 1/34
USPC .............................. 330/51, 86, 144, 282, 284
See application file for complete search history.

(56) References Cited

U.S. PATENT DOCUMENTS

| | | | |
|---|---|---|---|
| 8,519,786 B2 * | 8/2013 | Jang | H03G 1/0088 330/86 |
| 8,884,693 B2 * | 11/2014 | Lee | H03G 3/002 330/144 |
| 2012/0293353 A1 * | 11/2012 | Okumura | H03F 3/45475 330/86 |

* cited by examiner

*Primary Examiner* — Khanh V Nguyen
(74) *Attorney, Agent, or Firm* — WPAT, P.C.; Anthony King (57) ABSTRACT

The present invention discloses a gain control circuit capable of easing leakage current influence. According to an embodiment of the present invention, the gain control circuit comprises: at least one signal input end for receiving at least one input signal; a signal output end for outputting an output signal; an amplifier coupled between an amplifier input end and the signal output end; and a plurality of gain schemes. Each of the gain schemes is set between the at least one signal input end and the signal output end; and when one of the gain schemes is activated to generate the output signal, the rest gain schemes are inactivated to stop gain production and concurrently discharge leakage currents through their respective grounding paths.

15 Claims, 4 Drawing Sheets

GAIN CONTROL CIRCUIT AND METHOD CAPABLE OF EASING LEAKAGE CURRENT INFLUENCE

BACKGROUND OF THE INVENTION

1. Field of the Invention

The present invention relates to a gain control circuit and method, especially to a gain control circuit and method capable of easing leakage current influence.

2. Description of Related Art

Generally an adjustable gain circuit or a gain circuit for mixed-signal input has a plurality of gain paths as operation options. Each of the gain paths has a switch, and the on/off states of these gain paths will determine one among the gain paths as the working path; in other words, through the control over the switches, one of the gain paths will be conducting while the others will be non-conducting, so that the conducting path will be responsible for amplifying an input signal. In a normal case, the switches are realized by MOS transistors; however, MOS transistors inevitably suffer from leakage current especially when the amplitude of the input signal is getting high, which means that some of the MOS transistors supposed to be non-conducting will leak current due to the input signal of high amplitude. In the meantime, the leakage current will interfere with the conducting path and lead to the increase of total harmonic distortion (THD).

SUMMARY OF THE INVENTION

In consideration of the problems of the prior art, an object of the present invention is to provide a gain control circuit and method capable of easing leaking current influence.

The present invention discloses a gain control circuit capable of easing leakage current influence. An embodiment of the gain control circuit comprises: at least one signal input end operable to receive at least one input signal; a signal output end operable to output an output signal; an amplifier coupled between an amplifier input end and the signal output end; and a plurality of gain schemes, each of which is set between the at least one signal input end and the signal output end, so that when one of the gain schemes is activated to generate the output signal, the rest gain schemes are inactivated to stop gain production and concurrently discharge leakage currents. Said gain schemes includes a first gain scheme and a second gain scheme. The first gain scheme includes: a first node; a first signal path operable to electrically connect or disconnect the at least one signal input end with or from the amplifier input end through the first node according to a first control signal; and a first grounding path operable to electrically connect or disconnect the first node with or from a reference voltage end according to the inversion of the first control signal, and especially operable to disconnect the first node from the reference voltage end when the first signal path electrically connects the at least one signal input end with the amplifier input end through the first node. Similarly, the second gain scheme includes: a second node; a second signal path operable to electrically connect or disconnect the at least one signal input end with or from the amplifier input end through the second node according to a second control signal; and a second grounding path operable to electrically connect or disconnect the second node with or from the reference voltage end according to the inversion of the second control signal, and especially disconnect the second node from the reference voltage end when the second signal path electrically connects the at least one signal input end with the amplifier input end through the second node.

The present invention also discloses a gain control method carried out by the gain control circuit of the present invention or its equivalent and capable of easing leakage current influence. An embodiment of the gain control method comprises the following steps: a signal receiving step operable to receive at least one input signal; a signal generating step operable to generate an output signal according to the at least one input signal and a gain; and a gain selecting step operable to choose one among a plurality of gain schemes to determine the gain while each of the gain schemes is formed between the at least one input signal and the output signal and includes a signal path and a grounding path, so that when one of the gain schemes is activated to generate the output signal, the rest gain schemes are deactivated to stop gain production and concurrently discharge leakage currents. Said gain selecting step includes: choosing a target gain scheme among the plurality of gain schemes; having the signal path of the target gain scheme be conducting and the grounding path of the target gain scheme be non-conducting; and having the grounding paths of all the gain schemes except the target gain scheme be conducting and the signal paths of all the gain schemes except the target gain scheme be non-conducting.

The present invention further discloses a gain control circuit also capable of easing leaking current influence. An embodiment of this gain control circuit comprises: an amplifier including an amplifier input end and an amplifier output end; an input impedance circuit, coupled between a signal input end and the amplifier input end, operable to provide one of a plurality of input impedances which include a first input impedance and a second input impedance; and an output impedance circuit, coupled between the amplifier input end and the amplifier output end, operable to provide one of a plurality of output impedances or a constant output impedance, wherein when a signal is transmitted via the signal input end, the first input impedance and the output impedance circuit, a switch coupled between the second input impedance and the amplifier input end will be non-conducting but grounded through another switch.

These and other objectives of the present invention will no doubt become obvious to those of ordinary skill in the art after reading the following detailed description of the preferred embodiments that are illustrated in the various figures and drawings.

BRIEF DESCRIPTION OF THE DRAWINGS

FIG. 2b illustrates the first gain scheme of the analog-input gain circuit of FIG. 2a.

FIG. 2c illustrates the second gain scheme of the analog-input gain circuit of FIG. 2a.

FIG. 3b illustrates the first gain scheme of the analog mixed-signal gain circuit of FIG. 3a.

FIG. 3c illustrates the second gain scheme of the analog mixed-signal gain circuit of FIG. 3a.

DETAILED DESCRIPTION OF THE PREFERRED EMBODIMENTS

The following description uses language by referring to terms common in this invention field. If any term is defined in this specification, such term should be explained accordingly. Besides, the connection between objects or events in the disclosed embodiments can be direct or indirect provided that these embodiments are still applicable under such connection. Said "indirect" means that an intermediate object or a physical space is existed between the objects, or an intermediate event or a time interval is existed between the events. Furthermore, each embodiment in the following description includes one or more features; however, this doesn't mean that one carrying out the present invention should make use of all the features of one embodiment at the same time, or should only carry out different embodiments separately. In other words, if an implementation derived from one or more of the embodiments is applicable, a person of ordinary skill in the art can selectively make use of some or all of the features in one embodiment or selectively make use of the combination of some or all features in several embodiments to have the implementation come true, so as to increase the flexibility of carrying out the present invention.

The present invention discloses a gain control circuit and method capable of easing leakage current influence. The circuit and method are applicable to a lot of technical fields in need of gain control such as the audio field, communication field and display field. Provided that an alternative means is available and reasonable, people of ordinary skill in the art can use such means similar or equivalent to those described in this specification to carry out the present invention, which implies that the scope of this invention is not limited to the embodiments in this specification. On account of that some element of the gain control circuit of the present invention could be known, the detail of such element will be omitted provided that this omission nowhere dissatisfies the specification and enablement requirements. Besides, the gain control method can be in the form of firmware and/or software which could be carried out by the gain control circuit of this invention or the equivalent thereof; therefore, provided that the remaining disclosure is still enough for understanding and enablement, the following description will abridge the hardware details for carrying out the method, but put the emphasis on the steps.

Figure 1:
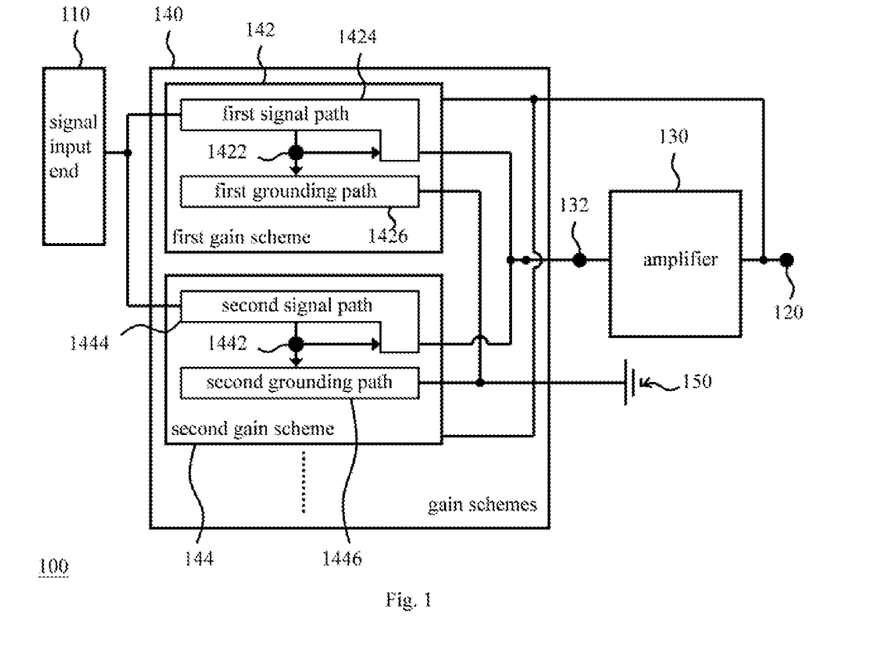
FIG. 1 illustrates an embodiment of the gain control circuit of the present invention.

Please refer to FIG. 1 which illustrates an embodiment of the gain control circuit of the present invention. The gain control circuit 100 is capable of easing leakage current influence and thereby reducing the total harmonic distortion. As it is shown in FIG. 1, the gain control circuit 100 comprises: at least one signal input end 110 operable to receive at least one input signal; a signal output end 120 operable to output an output signal; an amplifier 130 (e.g. an operational amplifier) coupled between an amplifier input end 132 (e.g. the inverting input end of an operational amplifier) and the signal output end 120; and a plurality of gain schemes 140, each of which is set between the at least one signal input end 110 and the signal output end 120 and includes a signal path and a grounding path, wherein when one of the gain schemes 140 (i.e. the activated gain scheme 140) generates the output signal according to the input signal through its signal path, the rest of the gain schemes 140 (i.e. the inactivated gain scheme(s)) will be coupled to a reference voltage end 150 (e.g. a grounding end) through its/their grounding path(s), so as to discharge the leakage current, if any, to the reference voltage end and thereby prevent the activated gain scheme 140 from leakage current influence. For instance, said gain schemes 140 include a first gain scheme 142, a second gain scheme 144 and the other gain scheme(s) (depicted in the dotted line in the figures). The first gain scheme 142 includes: a first node 1422; a first signal path 1424 operable to electrically connect or disconnect the at least one signal input end 110 with or from the amplifier input end 132 through the first node 1422 according to a first control signal (e.g. a switching signal); and a first grounding path 1426 operable to electrically connect or disconnect the first node 1422 with or from the aforementioned reference voltage end 150 according to the inversion of the first control signal. More specifically, when the first signal path 1424 electrically connects the at least one signal input end 110 with the amplifier input end 132 through the first node 1422, the first grounding path 1426 will electrically disconnect the first node 1422 from the reference voltage end 150. On the other hand, the second gain scheme 144 includes: a second node 1442; a second signal path 1444 operable to electrically connect or disconnect the at least one signal input end 110 with or from the amplifier input end 132 through the second node 1442 according to a second control signal (e.g. a switching signal); and a second grounding path 1446 operable to electrically connect or disconnect the second node 1442 with or from the reference voltage end 150 according to the inversion of the second control signal. To be more specific; when the second signal path 1444 electrically connects the at least one signal input end 110 with the amplifier input end 132 through the second node 1442, the second grounding path 1446 will electrically disconnect the second node 1442 from the reference voltage end 150.

Figure 2A:
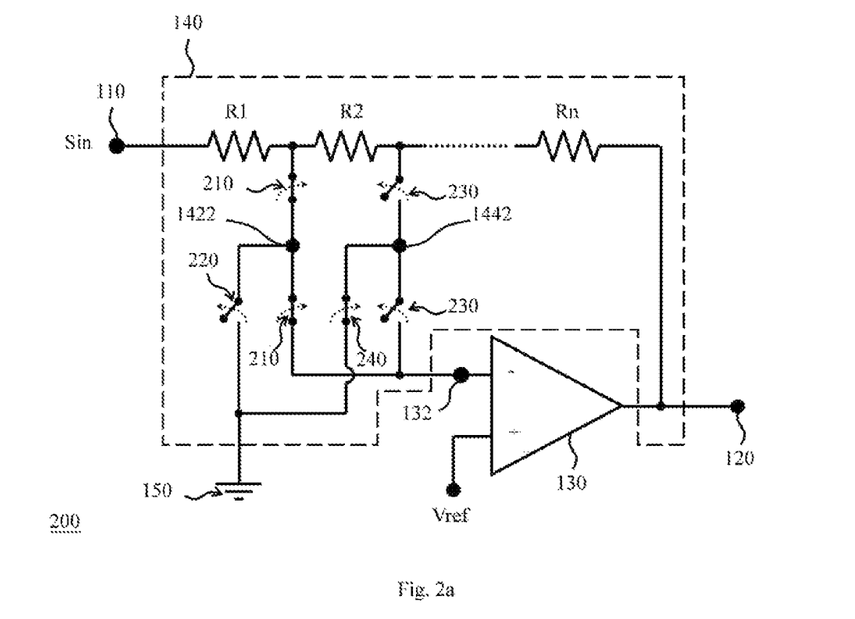
FIG. 2a illustrates an implementation example of the gain control circuit of FIG. 1.

Please refer to FIG. 2a which illustrates an implementation example of the gain control circuit 100 of FIG. 1. As it is shown in FIG. 2a, the implementation example is an analog-input gain circuit 200 which includes all the elements and signal ends of FIG. 1; however, for the purpose of clear illustration, the first gain scheme 142 and the elements thereof and the second gain scheme 144 and the elements thereof will not be marked in FIG. 2a, but will be shown in FIGS. 2b and 2c respectively (i.e. FIG. 2b dedicated to showing the first gain scheme 142 while FIG. 2c dedicated to showing the second gain scheme 144). Besides, the signal input end 110 in this implementation example is operable to receive a single input signal Sin as the input signal for each of the gain schemes 140; meanwhile, the amplifier 130 is an operational amplifier having the aforementioned amplifier input end 132 and a non-inverting input end coupled to a reference voltage Vref.

Figure 2B:
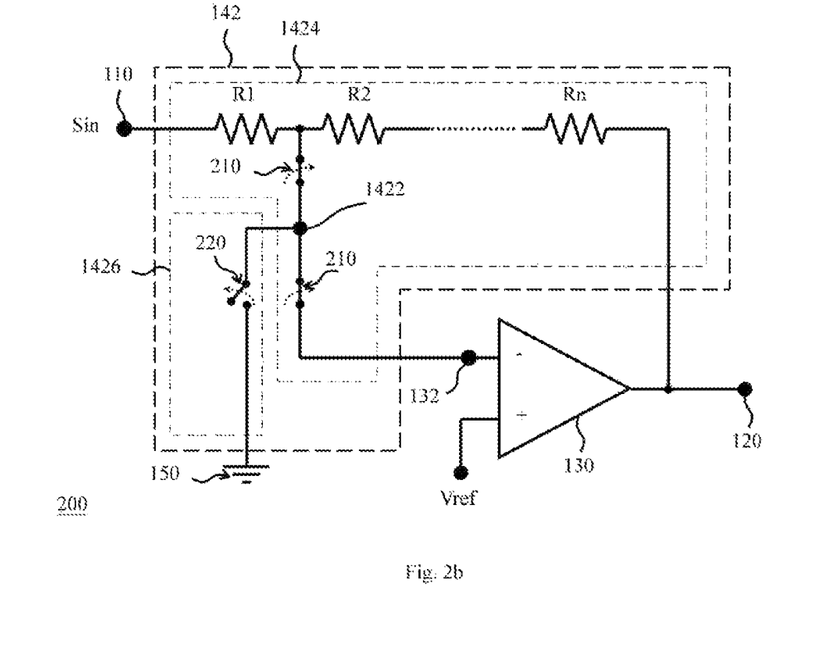

Please refer to FIG. 2a and FIG. 2b. The first signal path 1424 of the first gain scheme 142 includes two first switches 210 which are set at two sides of the aforementioned first node 1422 and operable to be conducting or non-conducting according to the first control signal. Furthermore, the first grounding path 1426 includes a first inverting switch 220 which is set between the first node 1422 and the reference voltage end 150 and operable to be conducting or non-conducting in accordance with the inversion of the first control signal; more specifically, when the two first switches 210 are conducting, the first inverting switch 220 will be non-conducting, and vice versa. Please note that in consideration of the balance between circuit operation and circuit area consumption, in this example the size of the first inverting switch 220 is smaller than any of the two first switches 210; for instance, if these switches are realized in MOSFETs, at least one of the width and length of the first inverting switch 220 will be smaller than that of the first switches 210.

Figure 2C:
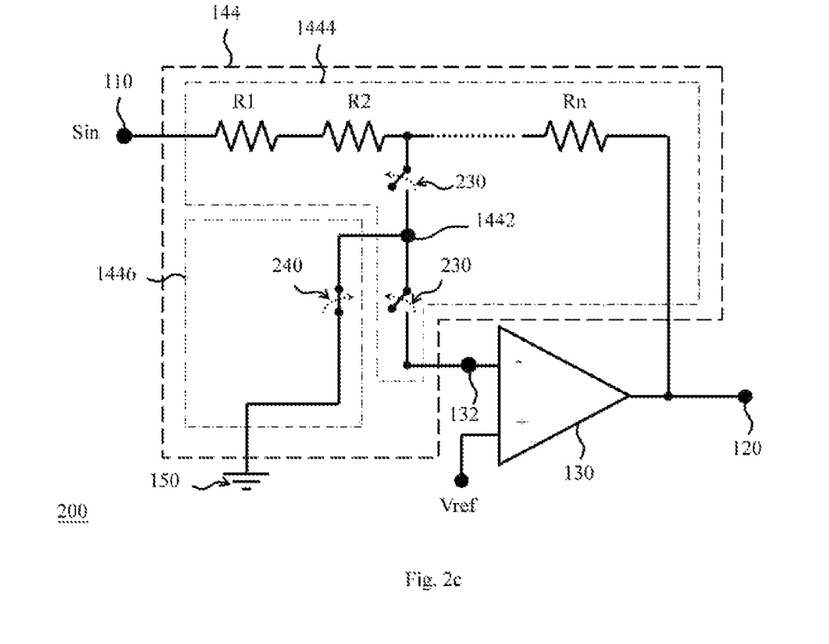

Please refer to FIG. 2a and FIG. 2c. Similarly, the second signal path 1444 of the second gain scheme 144 includes two second switches 230 which are set at two sides of the second node 1442 and operable to be conducting or non-conducting according to the second control signal. Besides, the second grounding path 1446 includes a second inverting switch 240 which is set between the second node 1442 and the reference voltage end 150 and operable to be conducting or non-conducting according to the inversion of the second control signal, which means that when the two second switches 230 are non-conducting, the second inverting switch 240 will be conducting, and vice versa. Moreover, in order to balance circuit operation and circuit area consumption, in this example the size of the second inverting switch 240 is smaller than any of the two second switches 230. Please refer to FIG. 2a and FIG. 2c again. In this case, when the second switch 230 (especially the one between the signal input end 110 and the second node 1442) is controlled to be non-conducting but leaking current due to its native/unavoidable incomplete shut, the second inverting switch 240 will discharge the leakage current to the reference voltage end 150 (e.g. a grounding end), so as to reduce the interference in the first signal path 1424 (including the first node 1422 and the amplifier input end 132) and thus prevent the total harmonic distortion from raising.

Please refer to FIG. 2a and FIG. 2b again. In this implementation example, the first gain scheme 142 includes a first input impedance (e.g. the resistance R1 in the Figures) and a first feedback impedance (e.g. the summation of the resistances R2 through Rn). More specifically, when the first signal path 1424 electrically connects the at least one signal input end 110 with the amplifier input end 132 through the first node 1422, the impedance between at least one signal input end 110 and the first node 1422 is viewed as the first input impedance while the impedance between the first node 1422 and the signal output end 120 is viewed as the first feedback impedance; in the meantime, the gain of the analog-input gain circuit 200 will be determined by the first input impedance and the first feedback impedance. Similarly, as shown in FIG. 2a and FIG. 2c, the second gain scheme 144 includes a second input impedance (e.g. the summation of the resistances R1 and R2 in the Figures) and a second feedback impedance (e.g. the summation of a resistance R3 (not shown) through the resistance Rn in the Figures). When the second signal path 1444 is chosen to electrically connect the at least one signal input end 110 with the amplifier input end 132 through the second node 1442, the impedance between at least one signal input end 110 and the second node 1442 is viewed as the second input impedance while the impedance between the second node 1442 and the signal output end 120 is viewed as the second feedback impedance; meanwhile, the gain of the analog-input gain circuit 200 will be determined by the second input impedance and the second feedback impedance.

Please note that the amount of switches, impedances, and etc. and the sizes of these elements in the figures are illustrative for understanding, not for limiting the scope of the present invention. People of ordinary skill in the art can determine the parameters of these elements as long as the corresponding implementation is still applicable. Please also note that although FIG. 2a through FIG. 2c take the first gain scheme 142 activated and the second gain scheme 144 inactivated for example, this is just for understanding. As it is described in the preceding paragraph, through the control over the connection (i.e. switching) states of the signal and grounding paths of each gain scheme 140, the present invention is able to choose an appropriate one for outputting a signal of proper gain.

Figure 3A:
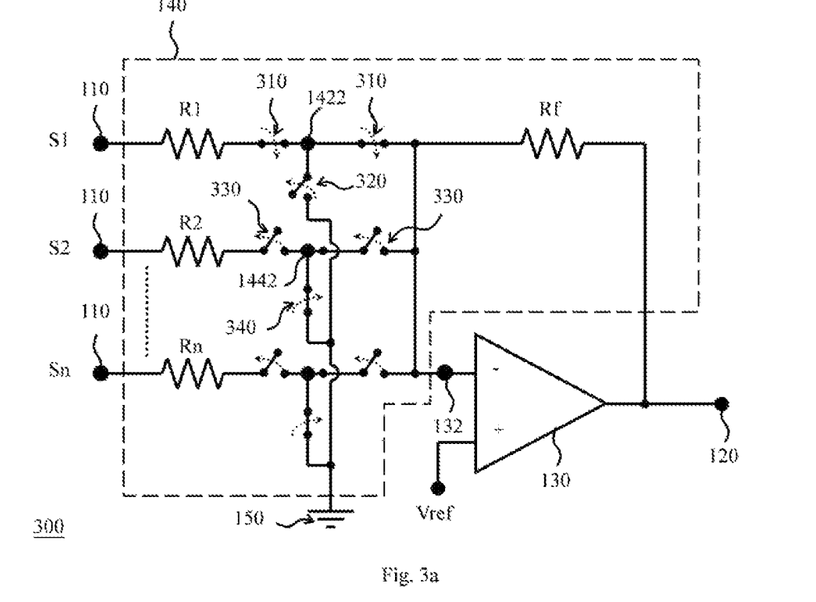
FIG. 3a illustrates another implementation example of the gain control circuit of FIG. 1.

Please refer to FIG. 3a which illustrates another implementation example of the gain control circuit 100 of FIG. 1. As it is shown in FIG. 3a, the implementation example is an analog mixed-signal gain circuit 300 which also comprises all the elements and signal ends of FIG. 1. However, for the purpose of clear illustration, the first gain scheme 142 and the elements thereof and the second gain scheme 144 and the elements thereof will not be marked in FIG. 3a, but will be shown in FIG. 3b and FIG. 3c respectively (i.e. FIG. 3b exclusively for showing the first gain scheme 142 while FIG. 3c exclusively for showing the second gain scheme 144). Besides, the signal input end 110 having a plurality of nodes in this example is operable to receive a plurality of input signals S1, S2, . . . , Sn, each of which is the input signal for an individual gain scheme 140; and the amplifier 130 here is still realized through an operational amplifier.

Figure 3B:
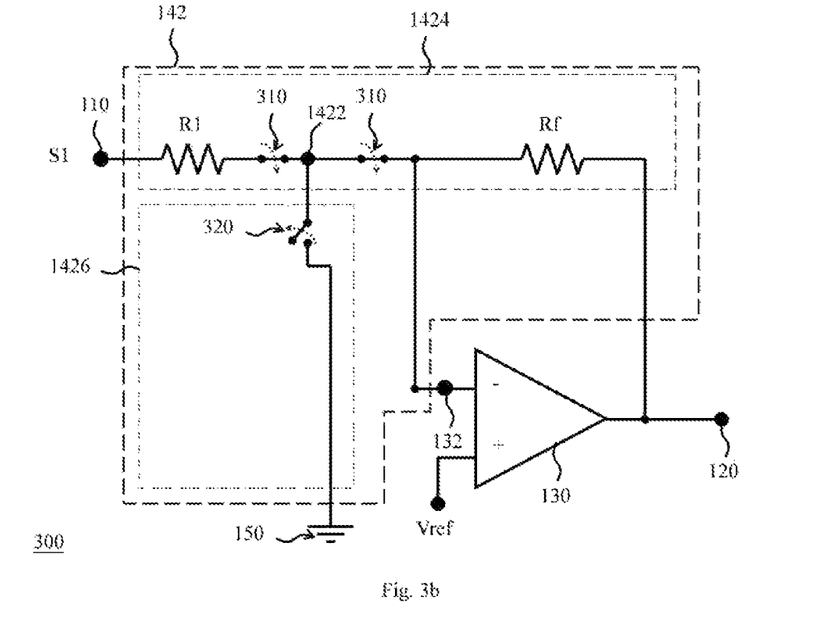

Please refer to FIG. 3a and FIG. 3b. The first signal path 1424 of the first gain scheme 142 includes two first switches 310 which are set at two sides of the aforementioned first node 1422 and operable to be conducting or non-conducting according to the first control signal. Furthermore, the first grounding path 1426 includes a first inverting switch 320 which is set between the first node 1422 and the reference voltage end 150 and operable to be conducting or non-conducting in accordance with the inversion of the first control signal; more specifically, when the two first switches 310 are conducting, the first inverting switch 320 will be non-conducting, and vice versa. For a similar reason as it is explained before, in consideration of the balance between circuit operation and circuit area consumption, in this example the size of the first inverting switch 320 is smaller than any of the two first switches 310; however, this is not a must but an optional choice.

Figure 3C:
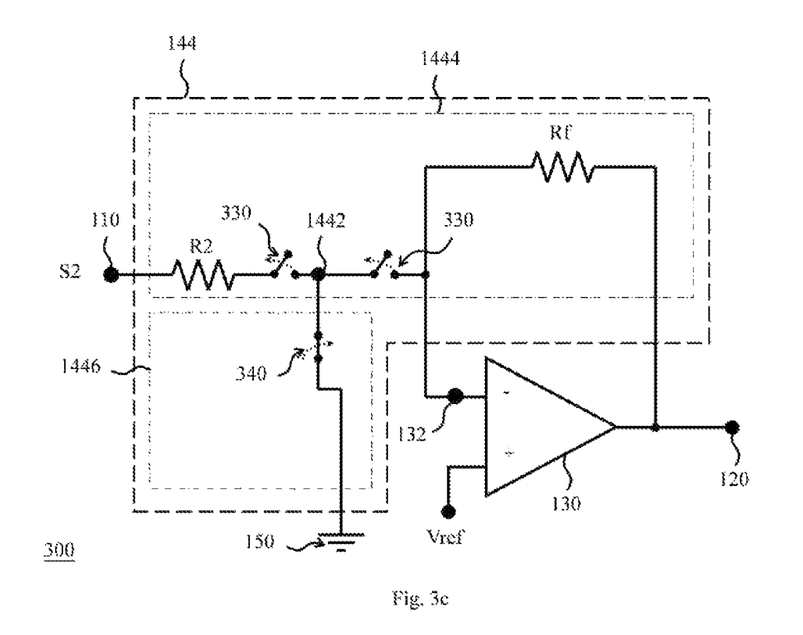

Please refer to FIG. 3a and FIG. 3c. The second signal path 1444 of the second gain scheme 144 includes two second switches 330 which are set at two sides of the second node 1442 and operable to be conducting or non-conducting according to the second control signal. Moreover, the second grounding path 1446 includes a second inverting switch 340 which is set between the second node 1442 and the reference voltage end 150 and operable to be conducting or non-conducting in accordance with the inversion of the second control signal; in other words, when the two second switches 330 are non-conducting, the second inverting switch 340 will be conducting, and vice versa. Similarly, in order to balance circuit operation and circuit area consumption, in this example the size of the second inverting switch 340 is smaller than any of the two second switches 330.

Please refer to FIG. 3a and FIG. 3b again. In this implementation example, the first gain scheme 142 includes a first input impedance (e.g. the resistance R1 in the Figures) and a feedback impedance (e.g. the resistance Rf in the Figures). More specifically, when the first signal path 1424 electrically connects the signal input end 110 with the amplifier input end 132 through the first node 1422, the impedance between the signal input end 110 and the first node 1422 is viewed as the first input impedance while the impedance between the first node 1422 and the signal output end 120 is viewed as the feedback impedance; in the meantime, the gain of the analog mixed-signal gain circuit 300 will be determined by the first input impedance and the feedback impedance. Similarly, as shown in FIG. 3a and FIG. 3c, the second gain scheme 144 includes a second input impedance (e.g. the resistance R2 in the Figures) and the same feedback impedance (e.g. the resistance Rf in the Figures). When the second signal path 1444 is chosen to electrically connect the signal input end 110 with the amplifier input end 132 through the second node 1442, the impedance between the signal input end 110 and the second node 1442 is viewed as the second input impedance while the impedance between the second node 1442 and the signal output end 120 is viewed as the feedback impedance; meanwhile, the gain of the analog mixed-signal gain circuit 300 will be determined by the second input impedance and the feedback impedance. Besides, in this implementation example, between the amplifier input end 132 and the feedback resistance (e.g. the resistance Rf in the Figures) could be set at least one balancing component (e.g. an element whose structure is the same as or similar to the structure of the switching component in a signal path of any of the gain schemes 140) (not shown) operable to compensate for the existence of the switching component in the signal path of the chosen gain scheme 140, so as to prevent the unbalance of circuit layout or operation caused by the switching component. For instance, if the analog mixed-signal gain circuit 300 chooses the first gain scheme 142 as the responsible one, the influence caused by the two first switches 310 can be neutralized by the balancing component; and if the analog mixed-signal gain circuit 300 adopts the second gain scheme 144, the influence caused by the two second switches 330 can be offset by the balancing component. Although the balancing component do help, in the present invention it is not a must; those of ordinary skill in the art can decide whether to introduce the balancing component or not.

Please note that the amount and size of the switches, impedances, and etc. of the foresaid analog-input gain circuit 200 or the analog mixed-signal gain circuit 300 are illustrative for understanding, not for limitation. People of ordinary skill in the art can determine the parameters of these elements according to design resources or requirements. Besides, although FIG. 3a through FIG. 3c take the first gain scheme 142 activated and the second gain scheme 144 inactivated for example, this is just for understanding. As it is described in the preceding paragraph, through the control over the connection (i.e. switching) states of the signal and grounding paths of each gain scheme 140, the present invention is able to choose an appropriate gain scheme, which may be composed of a stand-alone gain scheme or several gain schemes, for signal output. Moreover, the aforementioned first and second control signals and the inversion signals thereof could be generated by a control circuit (e.g. a switching control circuit) in accordance with a gain decision (e.g. a decision for an audio output effect). Since the implementation of said control circuit and the process of said gain decision are available in the current arts, the detail thereof is therefore omitted.

Please further note that the gain control circuits 200, 300 of FIG. 2a through FIG. 2c and FIG. 3a through FIG. 3c can be realized in the following way. The gain control circuit of the present invention comprises: an amplifier including an amplifier input end and an amplifier output end; an input impedance circuit, coupled between a signal input end and the amplifier output end, operable to provide one among several input impedances (e.g. one among the resistances R1, R1+R2, . . . , R1+R2+ . . . +Rn−1 in FIG. 2a or one among the resistances R1 through Rn in FIG. 3a) which include a first input impedance (e.g. the resistance R1 in FIG. 2a or FIG. 3a) and a second input impedance (e.g. one of the resistances R1+R2, . . . , R1+R2+ . . . +Rn−1 in FIG. 2a or one of the resistances R2 through Rn in FIG. 3a); and an output impedance circuit, coupled between the amplifier input end and the amplifier output end, operable to provide one among several output impedances (e.g. one among the resistances R2+ . . . +Rn, . . . , R2 in FIG. 2a) or a constant output impedance (e.g. the resistance Rf in FIG. 3a), wherein when a signal is transmitted via the signal input end, the first input impedance and the output impedance circuit, a switch (e.g. the switch 230 in FIG. 2c or the switch 330 in FIG. 3c) set between the second input impedance and the amplifier input end will be non-conducting and electrically connected to a reference voltage (e.g. a grounding voltage) through another switch (e.g. the switch 240 in FIG. 2c or the switch 340 in FIG. 3c). To be more specific. The output impedance circuit of FIG. 2a is an example capable of providing one among several output impedances; the output impedance circuit and the input impedance circuit share at least one impedance element (e.g. at least one of the resistances R2 through Rn−1 in FIG. 2a) and then define one among the several output impedances and one among the several input impedances by the allocation of the at least one impedance element. On the other hand, the output impedance circuit of FIG. 3a is an example capable of providing a constant output impedance (e.g. the resistance Rf in FIG. 3a). Since those of ordinary skill in the art can appreciate the detail and modifications of the above-mentioned gain control circuit through the foredisclosed embodiments, repeated and redundant description is therefore omitted provided that the remaining disclosure is still enough for understanding and enablement.

Figure 4:
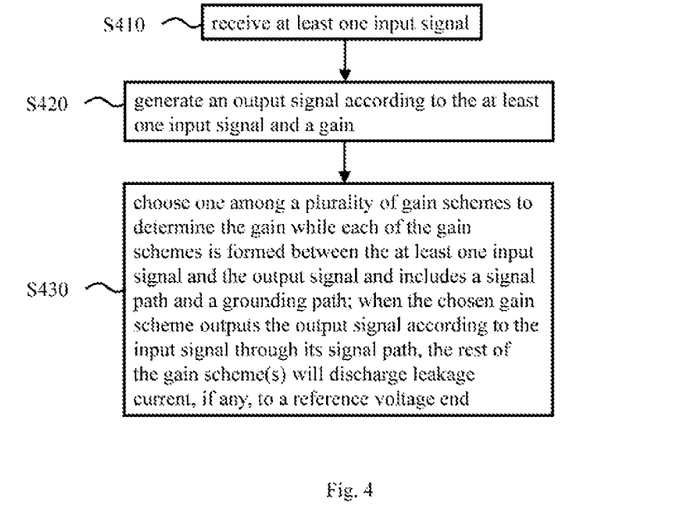
FIG. 4 illustrates an embodiment of the gain control method of the present invention.

Please refer to FIG. 4. In addition to the gain control circuit, the present invention also discloses a gain control method capable of easing leakage current influence. This method can be carried out by the circuit of the present invention or the equivalent thereof, and comprises the following steps:

Step S410: a signal receiving step operable to receive at least one input signal.

Step S420: a signal generating step operable to generate an output signal according to the at least one input signal and a gain.

Step S430: a gain selecting step operable to choose one among a plurality of gain schemes to determine the gain while each of the gain schemes is set between the at least one input signal and the output signal and includes a signal path and a grounding path; when the chosen gain scheme outputs the output signal according to the input signal through its signal path, the rest of the gain scheme(s) will discharge leakage current, if any, to a reference voltage end (e.g. a grounding end) through its/their grounding path(s). To be more specific. Step S430 includes: choosing a target gain scheme (e.g. the first gain scheme 142 or the second gain scheme 144 in FIG. 1) among the plurality of gain schemes; having the signal path of the target gain scheme be conducting and the grounding path of the target gain scheme be non-conducting; and having the grounding path(s) of all the gain scheme(s) except the target gain scheme be conducting and the signal path(s) of all the gain scheme(s) except the target gain scheme be non-conducting, so that the potential leakage current will be discharged to the reference voltage end through the grounding path(s) and thereby cause no/negligible interference to the target gain scheme.

Since people of ordinary skill in the art can appreciate the implementation detail and modifications of this method invention in light of the discussion about the device invention of FIG. 1 through FIG. 3c, repeated and redundant description is therefore omitted provided that the remaining description is still sufficient for understanding and enablement. Please note that there is no specific order for executing the steps of this method invention as long as the method is still applicable under such execution order.

To sum up. The gain control circuit and method of the present invention can effectively ease leakage current influence without significantly changing the conventional gain control framework/configuration. Therefore, this invention not only adapts to the existing gain control techniques, but also improves the problem of total harmonic distortion in a simple and effective way without much increase in circuit area consumption and cost.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A gain control circuit capable of easing leakage current influence, comprising:
   at least one signal input end operable to receive at least one input signal;
   a signal output end operable to output an output signal;
   an amplifier coupled between an amplifier input end and the signal output end; and
   a plurality of gain schemes, each of which is set between the at least one signal input end and the signal output end, including:
     a first gain scheme including:
       a first node;
       a first signal path operable to electrically connect or disconnect the at least one signal input end with or from the amplifier input end through the first node according to a first control signal; and
       a first grounding path operable to electrically connect or disconnect the first node with or from a reference voltage end according to the inversion of the first control signal, and especially operable to disconnect the first node from the reference voltage end when the first signal path electrically connects the at least one signal input end with the amplifier input end through the first node; and
     a second gain scheme including:
       a second node;
       a second signal path operable to electrically connect or disconnect the at least one signal input end with or from the amplifier input end through the second node according to a second control signal; and
       a second grounding path operable to electrically connect or disconnect the second node with or from the reference voltage end according to the inversion of the second control signal, and especially disconnect the second node from the reference voltage end when the second signal path electrically connects the at least one signal input end with the amplifier input end through the second node.

2. The gain control circuit of claim 1, wherein the second control signal is the inversion of the first control signal.

3. The gain control circuit of claim 1, wherein the first signal path includes two first switches which are set at two sides of the first node and operable to be conducting or non-conducting according to the first control signal.

4. The gain control circuit of claim 3, wherein the first grounding path includes a first inverting switch which is set between the first node and the reference voltage end and operable to be conducting or non-conducting according to the inversion of the first control signal, especially conducting when the two first switches are non-conducting.

5. The gain control circuit of claim 4, wherein the size of the first inverting switch is smaller than the size of any of the two first switches.

6. The gain control circuit of claim 1, wherein the second signal path includes two second switches which are set at two sides of the second node and operable to be conducting or non-conducting according to the second control signal.

7. The gain control circuit of claim 6, wherein the second grounding path includes a second inverting switch which is set between the second node and the reference voltage end and operable to be conducting or non-conducting according to the inversion of the second control signal, especially conducting when the two second switches are non-conducting.

8. The gain control circuit of claim 7, wherein the size of the second inverting switch is smaller than the size of any of the two second switches.

9. The gain control circuit of claim 1, wherein the first gain scheme includes a first input impedance and a first feedback impedance, and when the first signal path electrically connects the at least one signal input end with the amplifier input end through the first node, an impedance between the at least one signal input end and the first node is viewed as the first input impedance and an impedance between the first node and the signal output end is viewed as the first feedback impedance while the gain of the gain control circuit is determined by the first input impedance and the first feedback impedance.

10. The gain control circuit of claim 9, wherein the first signal path includes at least a switching component which is operable to be conducting or non-conducting according to the first control signal, and between the amplifier input end and the first feedback impedance is set at least a balancing component operable to compensate for the existence of the at least a switching component.

11. The gain control circuit of claim 1, wherein the second gain scheme includes a second input impedance and a second feedback impedance, and when the second signal path electrically connects the at least one signal input end with the amplifier input end through the second node, an impedance between the at least one signal input end and the second node is viewed as the second input impedance and an impedance between the second node and the signal output end is viewed as the second feedback impedance while the gain of the gain control circuit is determined by the second input impedance and the second feedback impedance.

12. The gain control circuit of claim 11, wherein the second signal path includes at least a switching component which is operable to be conducting or non-conducting according to the second control signal, and between the amplifier input end and the second feedback impedance is set at least a balancing component operable to compensate for the existence of the at least a switching component.

13. The gain control circuit of claim 1, wherein the amplifier is an operational amplifier.

14. A gain control method carried out by a gain control circuit and capable of easing leakage current influence, comprising the following steps:
   a signal receiving step operable to receive at least one input signal;
   a signal generating step operable to generate an output signal according to the at least one input signal and a gain; and
   a gain selecting step operable to choose one among a plurality of gain schemes to determine the gain while each of the gain schemes is set between the at least one input signal and the output signal and includes a signal path and a grounding path, including:
     choosing a target gain scheme among the plurality of gain schemes;
     having the signal path of the target gain scheme be conducting and the grounding path of the target gain scheme be non-conducting; and
     having the grounding paths of all the gain schemes except the target gain scheme be conducting and the signal paths of all the gain schemes except the target gain scheme be non-conducting.

15. A gain control circuit capable of easing leaking current influence, comprising:
   an amplifier comprising an amplifier input end and an amplifier output end;

an input impedance circuit, coupled between a signal input end and the amplifier input end, operable to provide one of a plurality of input impedances which comprise a first input impedance and a second input impedance; and an output impedance circuit, coupled between the amplifier input end and the amplifier output end, operable to provide one of a plurality of output impedances or a constant output impedance, wherein when a signal is transmitted via the signal input end, the first input impedance and the output impedance circuit, a switch coupled between the second input impedance and the amplifier input end will be non-conducting but grounded through another switch.

* * * * *